United States Patent
Schulz et al.

(10) Patent No.: US 8,054,084 B2
(45) Date of Patent: Nov. 8, 2011

(54) METHODS AND SYSTEMS FOR DIAGNOSING STATOR WINDINGS IN AN ELECTRIC MOTOR

(75) Inventors: Steven E. Schulz, Torrance, CA (US); Khwaja M. Rahman, Troy, MI (US); Chia-Chou Yeh, Lomita, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 231 days.

(21) Appl. No.: 12/468,362

(22) Filed: May 19, 2009

(65) Prior Publication Data

US 2010/0295491 A1 Nov. 25, 2010

(51) Int. Cl.
*G01R 31/06* (2006.01)
(52) U.S. Cl. ............... 324/545; 324/546; 324/765.01
(58) Field of Classification Search ......... 324/545, 324/546, 765.01
See application file for complete search history.

(56) References Cited

U.S. PATENT DOCUMENTS

| | | | |
|---|---|---|---|
| 6,069,467 A | 5/2000 | Jansen | |
| 6,828,752 B2 | 12/2004 | Nakatsugawa et al. | |
| 6,838,848 B2 | 1/2005 | Shindo | |
| 7,075,260 B2 | 7/2006 | Maeda | |
| 7,151,354 B2 | 12/2006 | Yoshinaga et al. | |
| 7,176,652 B2 | 2/2007 | Wakabayashi et al. | |
| 7,243,006 B2 | 7/2007 | Richards | |
| 7,286,906 B2 | 10/2007 | Richards | |
| 7,474,067 B2 | 1/2009 | Ueda et al. | |
| 7,671,552 B2 | 3/2010 | Tonamai et al. | |
| 7,768,220 B2 | 8/2010 | Schulz et al. | |
| 2002/0172509 A1* | 11/2002 | Kameya et al. | 388/800 |
| 2003/0062868 A1 | 4/2003 | Mir et al. | |
| 2003/0227271 A1 | 12/2003 | Shindo | |
| 2004/0109267 A1* | 6/2004 | Habetler | 361/23 |
| 2004/0169482 A1 | 9/2004 | Maeda | |
| 2005/0073280 A1 | 4/2005 | Yoshinaga et al. | |
| 2006/0192512 A1 | 8/2006 | Maeda | |
| 2006/0192513 A1 | 8/2006 | Maeda | |
| 2006/0192516 A1 | 8/2006 | Maeda | |
| 2007/0052381 A1 | 3/2007 | Ueda et al. | |
| 2009/0021194 A1 | 1/2009 | Tonami et al. | |
| 2009/0189561 A1* | 7/2009 | Patel et al. | 318/806 |

OTHER PUBLICATIONS

"Report of Large Motor Reliability Survey of Industrial and Commercial Installations, Part I," IEEE Transactions on Industry Applications, Jul. 1985, pp. 853-864, vol. IA-21, No. 4.

"Report of Large Motor Reliability Survey of Industrial and Commercial Installations, Part II," IEEE Transactions on Industry Applications, Jul. 1985, pp. 865-872, vol. IA-21, No. 4.

(Continued)

*Primary Examiner* — Huy Q Phan
*Assistant Examiner* — Son Le
(74) *Attorney, Agent, or Firm* — Ingrassia Fisher & Lorenz P.C.

(57) ABSTRACT

Systems and methods are provided for identifying a fault condition in stator windings in an electric motor. A method comprises applying a first signal at a first electrical angle to the stator windings and measuring a second signal from the stator windings in response to the first signal. The method further comprises determining a measured response for the electric motor at the first electrical angle based on the second signal and obtaining a nominal response for the electric motor at the first electrical angle. A fault condition is identified when a magnitude of the difference between the measured response and the nominal response is greater than a threshold value.

20 Claims, 3 Drawing Sheets

OTHER PUBLICATIONS

Albrecht, P.F. et al., "Assessment of the Reliability of Motors in Utility Applications—Updated," IEEE Transactions on Energy Conversions, Mar. 1986, pp. 39-46, vol. EC-1, No. 1.

Bonnett, A. H. et al., "Cause and analysis of stator and rotor failures in three-phase squirrel-cage induction motors," IEEE Transactions on Industry Applications, Jul./Aug. 1992, pp. 921-937, vol. 28, No. 4.

Kilman, G.B. et al., "A new approach to on-line turn fault detection in AC motors," IEEE Transactions on Industry Applications, 1996, pp. 687-693, vol. 1, San Diego, CA, USA.

Kohler, J.L. et al., "Alternatives for assessing the electrical integrity of induction motors," IEEE Transactions on Industry Applications, Sep./Oct. 1992, pp. 1109-1117, vol. 28, No. 5.

Siddique, A. et al., "Applications of artificial intelligence techniques for induction machine stator fault diagnostics: review," IEEE International Symposium on Diagnostics for Electric Machines, Power Electronics and Drives, Aug. 2003, pp. 29-34, vol./No. 24-26.

Khan, M.A.S.K. et al., "Real-Time Implementation of Wavelet Packet Transform-Based Diagnosis and Protection of Three-Phase Induction Motors," IEEE Transactions on Energy Conversions, Sep. 2007, pp. 647-655, vol. 22, No. 3.

Briz, F. et al., "Online stator winding fault diagnosis in inverter-fed AC machines using high-frequency signal injection," IEEE Transactions on Industry Applications Conference, Jul./Aug. 2003, pp. 1109-1117, vol. 39, No. 4.

Trutt, F.C. et al., "Detection of AC machine winding deterioration using electrically excited vibrations," IEEE Transactions on Industry Applications, Jan./Feb. 2001, pp. 10-14, vol. 37, No. 1.

Mirafzal, B. et al., "Interturn Fault Diagnosis in Induction Motors Using the Pendulous Oscillation Phenomenon," IEEE Transactions on Energy Conversions, Dec. 2006, pp. 871-882, vol. 21, No. 4.

Penman, J. et al., "Detection and location of interturn short circuits in the stator windings of operating motors," IEEE Transactions on Energy Conversions, Dec. 1994, pp. 652-658, vol. 9, No. 4.

Briz, F. et al., "Induction machine diagnostics using zero sequence components," IEEE Transactions on Industry Applications Conference, 2005, Oct. 2005, pp. 34-41, vol. 1, No. 2-6.

Cruz, S. M. A. et al., "Stator winding fault diagnosis in three-phase synchronous and asynchronous motors, by the extended park's vector approach," IEEE Transactions on Industry Applications Conference, 2000, Sep./Oct. 2001, pp. 1227-1233, vol. 37, No. 5.

Cruz, S. M. A. et al., "DSP implementation of the multiple reference frames theory for the diagnosis of stator faults in a DTC induction motor drive," IEEE Transactions on Energy Conversion, Jun. 2005, pp. 329-335, vol. 20, No. 2.

Grubic, S. et al. "A survey on testing and monitoring methods for stator insulation systems of low-voltage induction machines focusing on turn insulation problems," IEEE Transactions on Industrial Electronics, Dec. 2008, pp. 4127-4136, vol. 55, No. 12.

Yeh, C-C., "Methods and Systems for Performing Fault Diagnostics for Rotors of Electric Motors," U.S. Appl. No. 12/582,456, filed Oct. 20, 2009.

Yeh, C-C., "Methods and Systems for Diagnosing Faults for Rotors of Electric Motors," U.S. Appl. No. 12/854,772, filed Aug. 11, 2010.

Yeh, C-C., et al., "Methods and systems for diagnosing stator windings in an electric motor," U.S. Appl. No. 12/486,910, filed Jun. 18, 2009.

Notice of Allowance dated Apr. 22, 2010, issued in U.S. Appl. No. 12/108,868.

Chapman, P.L., et al. "Optimal Current Control Strategies for Surface-Mounted Permanent-Magnet Synchronous Machine Drives," IEEE Transactions on Energy Conversion, Dec. 1999, pp. 1043-1050, vol. 14, No. 4.

Choi, J-W., et al. "Novel Periodic Torque Ripple Compensation Scheme in Vector Controlled AC Motor Drives," IEEE Applied Power Electronics Conference and Exposition, Feb. 1998, pp. 81-85, vol. 1.

Favre, E. et al. "Permanent-Magnet Synchronous Motors: a Comprehensive Approach to Cogging Torque Suppression," IEEE Transactions on Industry Applications, Nov./Dec. 1993, pp. 1141-1149, vol. 29, No. 6.

Hung, J.Y. et al. "Minimization of Torque Ripple in Permanent Magnet Motors: a Closed Form Solution," IEEE Power Electronics and Motion Control, 1992, pp. 459-463, vol. 1.

Le-Huy, H., et al. "Minimization of Torque Ripple in Brushless DC Motor Drives," IEEE Transactions on Industry Applications, Jul./Aug. 1986, pp. 748-755, vol. IA-22, No. 4.

Kang, C. et al. "An Efficient Torque Control Algorithm for BLDCM with a General Shape of Back EMF," 24th Annual IEEE Power Electronics Specialist Conference, 1993, pp. 451-457.

Lee, S. et al. "A Harmonic Reference Frame Based Current Controller for Active Filter," IEEE School of Electrical Engineering, 2000, pp. 1073-1078.

Lu, C.W. et al. "Novel Approach to Current Profiling for AC Permanent Magnet Motors," IEEE Transactions on Energy Conversion, Dec. 1999, pp. 1294-1299, vol. 14, No. 4.

Wu, A.P. et al. "Cancellation of Torque Ripple Due to Nonidealities of Permanent Magnet Synchronous Machine Drives," IEEE Power Electronics Specialist Conference, 2003, pp. 256-261, vol. 1.

Benbouzid, M. E-H., "A Review of Inductions Motors Signature Analysis as a Medium for Faults Detection," IEEE Transactions on Industrial Electronics, Oct. 2000, pp. 984-993, vol. 47, No. 5.

Bellini, A., et al., "Quantitative Evaluation of Induction Motor Broken Bars by Means of Electrical Signature Analysis," IEEE Transactions on Industry Applications, Sep./Oct. 2001, pp. 1248-1255, vol. 37, No. 5.

Douglas, H. et al., "Broken Rotor Bar Detection in Induction Machines With Transient Operating Speeds," IEEE Transactions on Energy Conversion, Mar. 2005, pp. 135-141, vol. 20, No. 1.

Yazici, B. et al., "An Adaptive Statistical Time-Frequency Method for Detection of Broken Bars and Bearing Faults in Motors Using Stator Current," IEEE Transactions on Industry Applications, Mar./Apr. 1999, pp. 442-452, vol. 35, No. 2.

Kia, S.H. et al., "A High-Resolution Frequency Estimation Method for Three-Phase Induction Machine Fault Detection," IEEE Transactions on Industrial Electronics, Aug. 2007, pp. 2305-2314, vol. 54, No. 4.

Rajagopalan, S. et al., "Detection of Rotor Faults in Brushless DC Motors Operating Under Nonstationary Conditions," IEEE Transactions on Industry Applications, Nov./Dec. 2006, pp. 1464-1477, vol. 42, No. 6.

Blodt, M. et al., "On-Line Monitoring of Mechanical Faults in Variable-Speed Induction Motor Drives Using the Wigner Distribution," IEEE Transactions on Industrial Electronics, Feb. 2008, pp. 522-533, vol. 55, No. 2.

Douglas, H. et al., "A New Algorithm for Transient Motor Current Signature Analysis Using Wavelets," IEEE Transactions on Industry Applications, Sep./Oct. 2004, pp. 1361-1368, vol. 40, No. 5.

Cusido, J. et al., "Fault Detection in Inductions Machines Using Power Spectral Density in Wavelet Decomposition," IEEE Transactions on Industrial Electronics, Feb. 2008, pp. 633-643, vol. 55, No. 2.

Cruz, S.M.A. et al., "Diagnosis of Stator, Rotor and Airgap Eccentricity Faults in Three-Phase Induction Motors Based on the Multiple Reference Frames Theory," IEEE Industry Applications Conference, Oct. 2003, pp. 1340-1346, vol. 2.

Filippetti, F. et al., "AI Techniques in Induction Machines Diagnosis Including the Speed Ripple Effect," IEEE Transactions on Industry Applications, Jan./Feb. 1998, vol. 34, No. 1.

* cited by examiner

METHODS AND SYSTEMS FOR DIAGNOSING STATOR WINDINGS IN AN ELECTRIC MOTOR

TECHNICAL FIELD

Embodiments of the subject matter described herein relate generally to electrical systems in automotive vehicles, and more particularly, embodiments of the subject matter relate to systems and methods for diagnosing a fault condition in stator windings of an electric motor.

BACKGROUND

In recent years, advances in technology, as well as ever evolving tastes in style, have led to substantial changes in the design of automobiles. Electric motors (or electric machines) are finding an increasing number of applications in the automotive industry due to the electrification of the automotive drive system. Electric and/or hybrid vehicles utilize electric motors as either primary or supplemental torque sources in the automotive drive system. These electric motors are expected to function over extreme operating conditions for an extended period of time with high reliability. However, over time, the operating stresses applied to the electric motor may degrade the condition of the stator windings. For example, thermal stress and/or voltage stress may lead to insulation breakdown, which in turn, may result in partial short-circuiting and/or open-circuiting of individual turns of the stator windings.

In order to diagnose the stator windings, some prior art techniques utilize high frequency voltage injection by injecting a high-frequency voltage on top of the fundamental excitation voltage and measuring the resulting stator currents in the negative sequence carrier-signal reference frame. However, difficulties arise for certain machine types. For synchronous machines with inherent saliency (such as interior permanent magnet or synchronous reluctance type), as the rotor speed approaches zero, all frequencies in the electric motor converge to zero, in which case, the frequency components corresponding to stator winding faults become indistinguishable from the normal motor current frequency components. Even for synchronous machines without an inherent saliency, such as a surface mount permanent magnet machine, secondary effects such as saturation often result in significant saliency which can cause the same effect described above. For these reasons, for synchronous machines the rotor must be rotating at some non-zero speed in order to force spectral separation between the negative sequence components attributable to stator winding faults and the components due to the saliency of the machine. For asynchronous machines, such as an induction machine, a similar situation can arise due to saturation induced saliency or slot harmonics, unless the induction machine has a particular combination of rotor slots, stator slots, and pole pairs, which does not produce any conflicting negative-sequence components in the carrier-signals at zero speed or stall condition.

Some prior art techniques employ pulse-width modulation to extract the zero sequence voltage which may contain information related to stator winding faults. Similarly, this technique is not suitable for zero speed or low speed operation, as the motor harmonics converge to zero. Other methods for Volts per Hertz controlled drives examine the stationary frame stator currents to identify current distortion. However, this technique relies on a rotating electric field to detect the current imbalance, and is not suitable for zero speed or low speed operation. Thus, the prior art techniques are generally ineffective for stationary motors during start-up conditions, i.e., at zero or low rotor speed. In these situations, to detect the presence of a fault condition, the potentially faulty electric motor must be started and/or operated to detect the fault condition, which is counterintuitive and undesirable.

BRIEF SUMMARY

A method is provided for identifying a fault condition in stator windings in an electric motor. The method comprises applying a first signal at a first electrical angle to the stator windings and measuring a second signal from the stator windings in response to the first signal. The method further comprises determining a measured response for the electric motor at the first electrical angle based on the second signal and obtaining a nominal response for the electric motor at the first electrical angle. A fault condition is identified when a magnitude of the difference between the measured response and the nominal response is greater than a threshold value.

In accordance with another embodiment, a method is provided for diagnosing an electric motor. The method comprises applying an injection signal at an injection angle to the stator windings of the electric motor and determining a measured response for the electric motor at the injection angle in response to the injection signal. The measured response being influenced by the impedance of the electric motor at the injection angle. The method further comprises identifying a fault condition when a difference between the measured response and a nominal response for the electric motor at the injection angle is greater than a threshold value.

In another embodiment, an apparatus is provided for an electrical system for use in a vehicle. The electrical system comprises an electric motor having a set of stator windings and a rotor, an energy source, an inverter module coupled between the energy source and the set of stator windings, and a current sensor coupled between the inverter module and the set of stator windings. The current sensor is configured to measure current through the set of stator windings. A control module is coupled to the inverter module and the current sensor. The control module is configured to operate the inverter module to apply an injection voltage signal at an injection angle to the set of stator windings and determine a measured response value for the injection angle based on a measured current from the current sensor. The control module obtains a nominal response value for the electric motor at the injection angle and identifies a fault condition when a difference between the measured response value and the nominal response value is greater than a threshold value.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
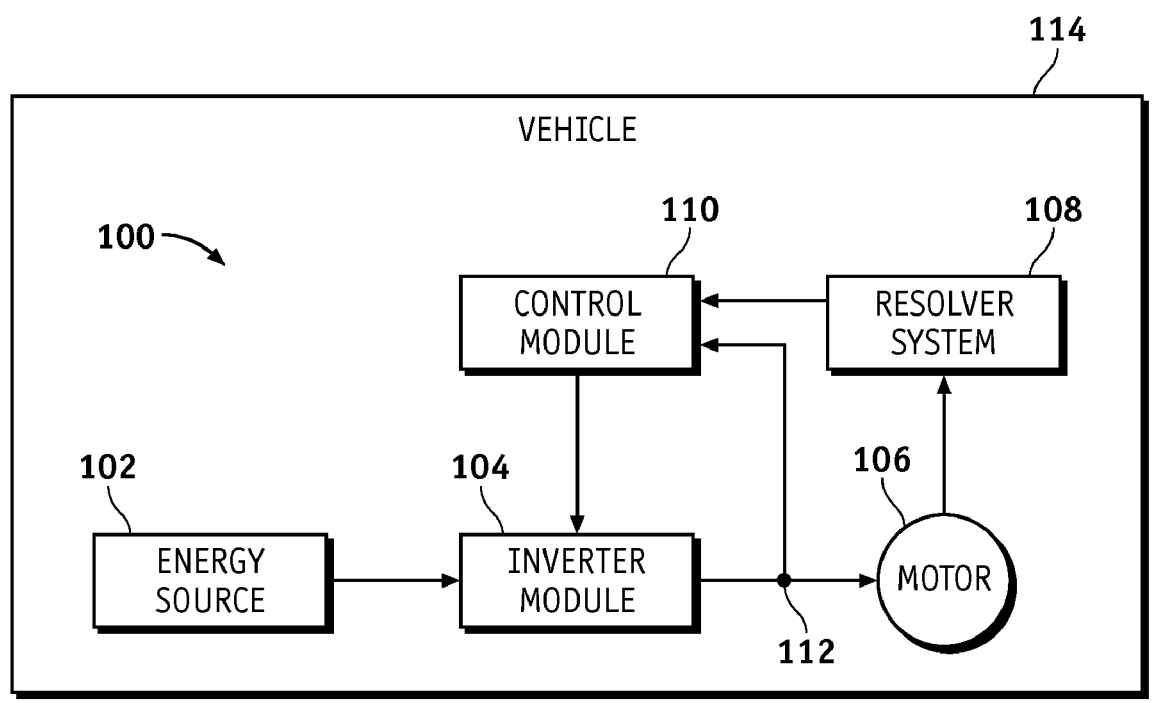
FIG. 1 is a block diagram of an electrical system suitable for use in a vehicle in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. In addition, certain terminology may also be used in the following description for the purpose of reference only, and thus is not intended to be limiting. The terms "first", "second" and other such numerical terms referring to structures do not imply a sequence or order unless clearly indicated by the context.

For the sake of brevity, conventional techniques related to electric motor construction and/or operation, signaling, sensing, pulse-width modulation (PWM), and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Technologies and concepts discussed herein relate generally to methods and systems for diagnosing a fault condition in the stator windings of an electric motor. An injection signal is applied to the stator windings at a particular injection angle, and a response signal is measured and utilized to determine the measured response for the injection angle. The measured response is compared to a nominal response for the injection angle, and the presence of a fault condition is identified based on the comparison. The injection angle is incrementally swept through a range of electrical angles to ensure that the electric motor is suitable for operation. The stator diagnostic process described herein may be performed with either salient or non-salient machines and without operating the electric motor or rotating the rotor (i.e., at substantially zero rotor speed).

FIG. 1 depicts an exemplary embodiment of an electrical system 100 suitable for use in a vehicle 114. The electrical system 100 includes, without limitation, an energy source 102, an inverter module 104, an electric motor 106, a resolver system 108, a control module 110, and a current sensor 112. It should be understood that FIG. 1 is a simplified representation of an electrical system 100 for purposes of explanation and is not intended to limit the scope or applicability of the subject matter described herein in any way.

In an exemplary embodiment, the inverter module 104 is coupled between the energy source 102 and the electric motor 106. In an exemplary embodiment, the current sensor 112 is coupled between the inverter module 104 and the electric motor 106 and configured to measure the current flowing through the stator windings of the electric motor 106, as described in greater detail below. The control module 110 is coupled to the current sensor 112 and configured to obtain the measured current through the stator windings of the electric motor 106 from the current sensor 112. The resolver system 108 is coupled between the electric motor 106 and the control module 110, and the resolver system 108 is suitably configured to measure or otherwise obtain the position of the rotor of the electric motor 106 and provide the result to control module 110. As described in greater detail below, in an exemplary embodiment, the control module 110 is suitably configured to utilize pulse-width modulation (PWM) techniques to control the voltage and/or current provided to the electric motor 106 via the inverter module 104. In an exemplary embodiment, the control module 110 is configured to identify a fault condition in the stator windings of the electric motor 106, as described in greater detail below.

In an exemplary embodiment the vehicle 114 is realized as an automobile. In alternative embodiments, the vehicle 114 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The vehicle 114 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, a combustion/electric motor hybrid engine, and an electric motor. In alternative embodiments, the vehicle 114 may be a plug-in hybrid vehicle, a fully electric vehicle, a fuel cell vehicle (FCV), or another suitable alternative fuel vehicle.

In an exemplary embodiment, the energy source 102 (or power source) is capable of providing a direct current (DC) voltage to the inverter module 104 for operating the electric motor 106. Depending on the embodiment, the energy source 102 may be realized as a battery, a fuel cell, a rechargeable high-voltage battery pack, an ultracapacitor, or another suitable energy source known in the art.

Depending on the embodiment, the electric motor 106 may be realized as an induction motor, an internal permanent magnet (IPM) motor, a synchronous reluctance motor, or another suitable motor known in the art, and the subject matter described herein should not be construed as being limited to use with any particular type of electric motor. In this regard, the electric motor 106 may be realized as a non-salient machine (e.g., an induction motor, permanent surface mount machine) having a spatial impedance that is independent of the rotor position or a salient machine (e.g., a synchronous reluctance motor, interior permanent magnet motor) having a spatial impedance that depends on the rotor position with respect to the stator windings, as will be appreciated in the art and described in greater detail below.

In an exemplary embodiment, the electric motor 106 is a three-phase alternating current (AC) electric machine having a rotor and stator windings (or coils). In an exemplary embodiment, for a three-phase motor, the stator windings are arranged in three sets of windings, wherein each set of windings corresponds to a phase of the electric motor 106. In this regard, although FIG. 1 depicts a single current sensor 112 for ease of explanation, in practice, the number of current sensors will be equal to the number of phases of the electric motor 106 to obtain the current for the respective phases of the electric motor 106. It should be understood that although the subject matter may be described herein in the context of a three-phase electric motor, the subject matter is not limited to three-phase machines and may be adapted for an electric motor having any number of phases.

In an exemplary embodiment, the inverter module 104 includes a power inverter configured to convert the DC power from the energy source 102 into AC power for driving the electric motor 106 in a conventional manner, as will be appreciated in the art. In this regard, the inverter module 104 includes one or more phase legs corresponding to the one or more phases of the electric motor 106, wherein switches of the phase leg are modulated (opened or closed) at a particular switching frequency to produce an AC voltage across the stator windings of the electric motor 106, which in turn creates torque-producing current in the stator windings and operates the electric motor 106, as will be appreciated in the art.

In an exemplary embodiment, the resolver system 108 comprises a resolver coupled to the electric motor 106, and the output of the resolver is coupled to a resolver-to-digital converter. The resolver (or similar sensing device) senses the position of the rotor of the electric motor 106. The resolver-to-digital converter converts the signals from the resolver to digital signals (e.g., a digital rotor position signal) which are provided to the control module 110.

The control module 110 may be implemented or realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, the control module 110 may be realized as a microprocessor, a controller, a microcontroller, a state machine, or the like. The control module 110 may also be implemented as a combination of computing devices, e.g., a combination of a digital signal processor and a microprocessor, a plurality of microprocessors, one or more microprocessors in conjunction with a digital signal processor core, or any other such configuration. In practice, the control module 110 includes processing logic that may be configured to carry out the functions, techniques, and processing tasks associated with the operation of the electrical system 100, as described in greater detail below. Furthermore, the steps of a method or algorithm described in connection with the embodiments disclosed herein may be embodied directly in hardware, in firmware, in a software module executed by the control module 110, or in any practical combination thereof.

The control module 110 is configured to identify or detect the existence of a fault condition in the stator windings of the electric motor 106 based on a change in the spatial impedance of the electric motor 106, as described in greater detail below. In an exemplary embodiment, the control module 110 identifies a fault condition based on a high-frequency injection signal and a measured response signal obtained by via the one or more current sensors 112. In this regard, the control module 110 is configured to vary the duty cycles of pulse width modulation (PWM) commands used to modulate the switches of the inverter phase leg to apply a high-frequency injection signal to the stator windings of the electric motor 106 at a particular injection angle, as described in greater detail below. Although FIG. 1 depicts the control module 110 and the inverter module 104 as distinct and separate elements, in practice, the control module 110 may be integral with (or incorporated) in the inverter module 104.

As described in greater detail below, in accordance with one embodiment, the control module 110 contains a suitable amount of memory for maintaining a table (or another suitable data structure) that maintains an association between nominal response values for the electric motor 106. The nominal response values are representative of the spatial impedance of the electric motor versus angular position when the stator windings of the electric motor 106 are fault-free.

Figure 2:
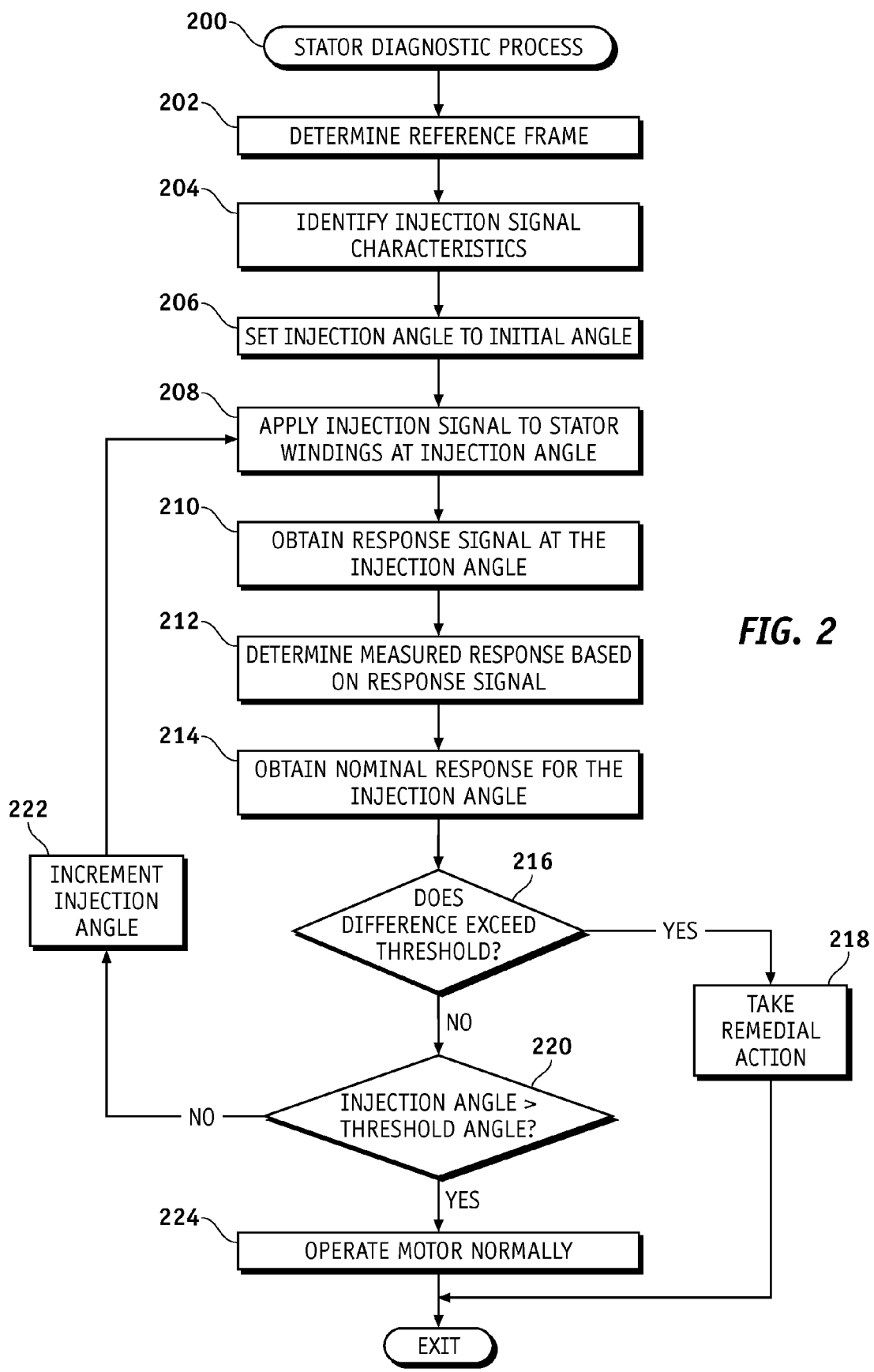
FIG. 2 is a flow diagram of an exemplary stator diagnostic process suitable for use with the electrical system of FIG. 1 in accordance with one embodiment.

Referring now to FIG. 2, in an exemplary embodiment, an electrical system may be configured to perform a stator diagnostic process 200 and additional tasks, functions, and operations described below. The various tasks may be performed by software, hardware, firmware, or any combination thereof. For illustrative purposes, the following description may refer to elements mentioned above in connection with FIG. 1. In practice, the tasks, functions, and operations may be performed by different elements of the described system, such as the inverter module 104, the resolver system 108, the current sensor(s) 112 and/or the control module 110. It should be appreciated any number of additional or alternative tasks may be included, and may be incorporated into a more comprehensive procedure or process having additional functionality not described in detail herein.

Referring again to FIG. 2, and with continued reference to FIG. 1, in an exemplary embodiment, the stator diagnostic process 200 is performed to diagnose the stator windings of an electric motor. The stator diagnostic process 200 may be performed at start-up, that is, prior to operating the electric motor when the speed of the rotor is zero or substantially zero (e.g., negligibly and/or imperceptibly small). The stator diagnostic process 200 begins by determining a reference frame for use in diagnosing the electric motor (task 202). The reference frame is a physical frame of reference used for determining and/or calculating the angular position of an injection signal, as described in greater detail below. In an exemplary embodiment, the stator diagnostic process 200 determines the reference frame based on the position of the rotor. For example, the stator diagnostic process 200 may determine a synchronous reference frame aligned with a particular feature (or characteristic) of the electric motor for use as the reference frame. In accordance with one embodiment, the synchronous reference frame comprises a Cartesian coordinate frame that is synchronous with the rotation of the rotor within the electric motor 106. In accordance with one embodiment, the resolver system 108 obtains the position for the rotor and provides the rotor position to the control module 110 which determines the synchronous reference frame based on the rotor position such that the one axis (e.g., the d-axis) is aligned with a feature of the electric motor 106, such as, for example, the rotor magnet north pole or the rotor flux. It will be appreciated in the art that the particular feature of the electric motor chosen to align the synchronous reference frame with will vary depending on the particular type of electric motor and the particular implementation of the electrical system 100. For example, if the electric motor 106 is realized as a permanent magnet synchronous motor, the d-axis of the synchronous reference frame may be aligned with the rotor magnet north pole, while in the case of an electric motor 106 realized as an induction motor, the d-axis may be aligned with the rotor flux.

The stator diagnostic process 200 continues by identifying the characteristics of the injection signal to be used in diagnosing the electric motor (task 204). The injection signal is preferably realized as a high-frequency electrical signal (e.g., a voltage signal or a current signal) having a constant amplitude. As used herein, a "high-frequency signal" should be understood as referring to a signal with a frequency that is great enough to avoid generating enough torque to overcome the inertial forces for the rotor of the electric motor, that is, a frequency great enough to avoid perceptible rotation of the electric motor. In other words, the frequency of the injection signal is such that the rotational speed of the rotor is zero or substantially equal to zero (e.g., negligibly and/or imperceptibly small). In this regard, in an exemplary embodiment, the frequency of the injection signal is greater than about 200 Hz. The frequency of the injection signal is preferably less than one half of the sampling frequency of the control module 110 to avoid aliasing and other undesirable analog-to-digital conversion effects. In an exemplary embodiment, the injection signal is realized as a pulse-width modulated voltage signal applied to the stator windings of the electric motor 106, as described in greater detail below. The amplitude of the injection signal will vary depending on the voltage of the energy source 102 the power rating and/or other characteristics of the electric motor 106.

In an exemplary embodiment, the stator diagnostic process 200 continues by setting the injection angle to an initial electrical angle with respect to the reference frame and applying the injection signal to the stator windings of the electric motor at the injection angle (tasks 206, 208). As used herein, "electrical angle" should be understood as referring to the angular position of the injection signal relative to the reference frame per pole pair of the electric motor. In accordance with one embodiment, the initial injection angle is equal to an angle of zero degrees with respect to the d-axis of the synchronous reference frame. In other words, the injection signal is initially aligned with the d-axis of the synchronous reference frame. In an exemplary embodiment, the control module 110 applies the injection signal by modulating and/or operating the phase legs of the inverter module 104 using pulse-width modulation to produce a voltage signal across the stator windings of the electric motor 106 having the appropriate amplitude and frequency and an electrical angle with respect to the synchronous reference frame that is equal to the injection angle. In an exemplary embodiment, the injection signal is applied for a predetermined time period to account for transients and ensure that the resulting response signal in the stator windings is substantially sinusoidal. For example, the stator diagnostic process 200 may apply the injection voltage signal for approximately ten milliseconds to ensure that the current in the stator windings is substantially sinusoidal.

The stator diagnostic process 200 continues by measuring or otherwise obtaining the response signal at the injection angle that results from the injection signal (task 210). The measured response signal is influenced by impedance characteristics of the electric motor 106, such as, for example, the inductances and/or resistances of the respective phase windings. In the case of an injection voltage signal, the stator diagnostic process 200 determines and/or obtains the current through the stator windings at the injection angle. In this regard, the one or more current sensors 112 measures and/or obtains the current through the stator windings of the electric motor 106. In an exemplary embodiment, the control module 110 obtains measured currents from the current sensor(s) 112. The control module 110 converts and/or transforms the measured currents from the stationary frame to the synchronous reference frame aligned with the injection axis. The control module 110 then demodulates the measured current signal from the injection axis, and calculates and/or computes the amplitude of the demodulated current signal.

In an exemplary embodiment, the stator diagnostic process 200 continues by determining and/or calculating a measured response for the electric motor at the injection angle based on the obtained response signal (task 212). In this regard, the measured response comprises a metric for diagnosing the condition of the stator winding. In accordance with one embodiment, the stator diagnostic process 200 determines the measured response as the amplitude of the measured response signal. In another embodiment, the stator diagnostic process 200 determines the measured response by calculating the observed impedance for the electric motor at the injection angle based on the ratio of the injection signal to the amplitude of the response signal. For example, if the injection signal is a voltage signal, the observed impedance of the electric motor at the injection angle is equal to the ratio of the amplitude of the injection voltage to the amplitude of the measured current.

The stator diagnostic process 200 continues by obtaining a nominal response for the electric motor at the injection angle (task 214). The nominal response value corresponds to the expected response for the electric motor in response to the injection signal at the injection angle, that is, the expected measured response for the electric motor at the injection angle in the absence of a fault condition in the stator windings. In this regard, nominal response values for the electric motor may be predetermined and/or previously obtained by applying the injection signal over a range of injection angles to a healthy (e.g., fault-free stator windings) electric motor. The control module 110 may implement a table or another suitable data structure that maintains an association between the injection angle and a previously measured and/or obtained nominal response value for the electric motor at the respective injection angle. For example, if the measured response comprises the amplitude of the measured current signal, the control module 110 may store values corresponding to the amplitude of the nominal current response for a healthy motor in response to the injection signal over a range of injection angles. In alternative embodiments, if the measured response comprises the observed impedance of the electric motor at the injection angle, the control module 110 may store values corresponding to the nominal impedance of a healthy motor, e.g., the ratio of the amplitude of the injection voltage signal to the amplitude of the nominal current for the healthy motor at the respective injection angle. In alternative embodiments, the control module 110 and/or stator diagnostic process 200 may be configured to calculate and/or determine the nominal response value (e.g., the nominal current and/or the nominal impedance) as a function of the injection angle.

The range of injection angles for which values are maintained will vary depending on the particular application and the type and/or characteristics of the electric motor being utilized. For example, non-salient machines exhibit a spatial impedance that is substantially uniform over the full electrical cycle, in which case the range of injection angles for which data is needed to adequately diagnose the stator windings may be only a fraction of a full electrical cycle depending on characteristics of the particular motor. In other words, if the electric motor has a uniform nominal response, the control module 110 may only maintain a single nominal response value for the electric motor (e.g., the response at an injection angle of 0°) which may be utilized to diagnose the electric motor over a range of injection angles. However, salient machines exhibit a spatial impedance that is a function of the angular position of the injection signal. In this case, the range of injection angles should ensure that all motor axes are excited in order to adequately diagnose the stator windings. For example, in accordance with one embodiment, if the electric motor is a three-phase salient machine, the control module 110 maintains nominal response values for injection angles comprising one half of an electrical cycle (e.g., injection angles ranging from 0° to at least 180° or $\pi$ radians).

In an exemplary embodiment, the stator diagnostic process 200 continues by comparing the measured response value to the nominal response value for the injection angle and determining whether a magnitude of a difference between the measured response value and the nominal response value is greater than a threshold value (task 216). The threshold value is chosen to be a value that is indicative of a fault condition. In this regard, the threshold value is preferably large enough such that any difference between the measured response value and the nominal response value that exceeds the threshold value is attributable to a fault condition (e.g., short-circuited and/or open-circuited stator winding turns) rather than noise, transients, component tolerances, or other circuit level effects. In other words, any difference between the measured response value and the nominal response value that exceeds the threshold value is attributable to changes in the impedance of the stator windings (e.g., changes in the resistance and/or impedance of the stator windings) and indicates the existence of a fault condition (or a likelihood of a fault condition). In this manner, the stator diagnostic process 200 and/or control module 110 identifies and/or detects a fault condition (or a sufficient likelihood of a fault condition) when the difference between the measured response value and the nominal response value exceeds the threshold value. In an exemplary embodiment, the threshold value comprises a percentage of the nominal response value, for example, twenty percent of the nominal response value at the injection angle or twenty percent of the average nominal response value across the range of injection angles.

In an exemplary embodiment, the stator diagnostic process 200 continues by taking remedial actions and/or other measures to ensure safe and/or effective operation of the electrical system in response to a difference between the measured response and the nominal response that exceeds the threshold value (task 218). In accordance with one embodiment, the stator diagnostic process 200 prevents operation of the electric motor in response to identifying the fault condition. For example, the control module 110 may set all the switches of the inverter module 104 to an open state to prevent current to the stator windings. In another embodiment, the stator diagnostic process 200 and/or electrical system 100 may be configured to physically restrict the movement of the rotor if a fault condition exists. In this manner, the stator diagnostic process 200 may thereby disable starting and/or operating the electric motor. In some embodiments, the stator diagnostic process 200 may enable operation of the electric motor with reduced capabilities, for example, by modifying the control scheme to limit the current through the electric motor or by limiting the torque production and/or rotor speed. In addition, the stator diagnostic process 200 may be configured to take additional remedial measures, such as, for example, providing notification of a fault condition to an electronic control system or another component in the vehicle which causes an audible and/or visual warning to be generated in the vehicle. It should be appreciated that any number of remedial actions and various combinations thereof may be utilized in any practical embodiment.

In addition, in some embodiments, the stator diagnostic process 200 may be configured to determine and/or identify the particular phase of the stator windings of the electric motor 106 that the fault condition is attributable to. For example, the injection angles for which the measured response deviates from the nominal response by greater than the threshold value may be compared to the phase axis angles to isolate which of the phase windings is experiencing a fault condition (e.g., short circuited and/or open circuited stator winding turns). When the injection angle is aligned with one of the phase axis angles, then the fault condition is attributable to the respective phase which the injection angle is aligned with. In this manner, the stator diagnostic process 200 determines and/or identifies the phase of the stator windings of the electric motor 106 which the fault condition is attributable to based on the injection angle. The stator diagnostic process 200 may be configured to record or otherwise indicate the particular phase of the stator windings that is exhibiting the fault condition, thereby accelerating any subsequent maintenance and/or repair.

If the difference between the measured response value and the nominal response value does not exceed the threshold value, the stator diagnostic process 200 continues by determining whether the injection angle is greater than or equal to a threshold angle (task 220). The difference between the threshold angle and the initial injection angle represents a portion of the electrical cycle that is sufficient to adequately diagnose the electric motor and conclude whether it is suitable for normal operation. If the stator diagnostic process 200 determines that the injection angle is greater than or equal to the threshold angle, the stator diagnostic process 200 determines that no fault condition exists and exits. As set forth above, the threshold angle will likely vary depending on the type of electric motor being diagnosed. In the case of non-salient machines exhibiting substantially uniform spatial impedance over the full electrical cycle, the threshold angle may be less than a full electrical cycle from the initial injection angle, for example, 180° electrical relative to the initial injection angle. In the case of salient machines exhibiting nonuniform spatial impedance, the threshold angle should correspond to a large enough portion of the electrical cycle to ensure that all motor axes are excited. For example, in the case of a three-phase salient machine, the threshold angle may be chosen to be 180° electrical relative to the initial injection angle to ensure that all three axes of the motor are excited.

If the stator diagnostic process 200 determines that the injection angle is less than the threshold angle, the stator diagnostic process 200 continues by incrementing the injection angle (task 222). In an exemplary embodiment, the stator diagnostic process 200 incrementally increases the injection angle in the synchronous reference frame. In other words, the stator diagnostic process 200 rotates the injection signal in a counterclockwise direction in the synchronous reference frame.

In an exemplary embodiment, the stator diagnostic process 200 incrementally increases the injection angle by a fixed increment amount. The increment amount represents a tradeoff between the number of locations (or data points) within the electrical cycle at which the electric motor is analyzed and the total amount of time required to complete the stator diagnostic process 200. For example, a smaller fixed increment amount will result in more injection angle increments before the injection angle reaches the threshold angle (and therefore require a greater amount of time to complete the stator diagnostic process 200), but at the same time, the smaller fixed increment amount provides more data points for analyzing the spatial impedance and/or health of the electric motor, resulting in a more reliable diagnosis. Conversely, a larger fixed increment amount will result in fewer injection angle increments before reaching the threshold angle (and therefore require a lesser amount of time to complete the stator diagnostic process 200), but at the same time, the larger fixed increment amount provides fewer data points for analyzing the spatial impedance and/or health of the electric motor. For example, assuming a threshold angle of 180° electrical and a fixed increment amount of 5° electrical, the stator diagnostic process 200 traverses a total of thirty-six individual increments before reaching the threshold angle. If the injection signal is applied for 10 milliseconds at each injection angle, the stator diagnostic process 200 requires roughly thirty-six hundredths of a second to run to completion in the case of a healthy motor. As described in greater detail below, if a fault condition is detected in the electric motor, the stator diagnostic process 200 may take even less time. For a larger fixed increment amount of 10° electrical, the stator diagnostic process 200 traverses only eighteen increments before reaching the threshold angle, that is, the stator diagnostic process 200 requires eighteen hundredths of a second to run to completion.

In an exemplary embodiment, the loop defined by tasks 208, 210, 212, 214, 216, 218, 220 and 222 repeats until the injection angle traverses a sufficient portion of the electrical cycle or a fault condition is detected. In this manner, the stator diagnostic process 200 sweeps the injection angle from the initial injection angle to a final injection angle (e.g., the threshold angle) before determining that the electric motor is suitable for operation. When the magnitude of the difference between the measured response and the nominal response is less than the threshold value and the injection angle is greater than or equal to the threshold angle, the stator diagnostic process 200 continues by operating the electric motor in normal manner (task 224). In this regard, the control module 110 may utilize PWM signals to produce a commanded and/or desired torque in the electric motor 106 or operate the motor with a desired rotational speed for the rotor, as will be appreciated in the art.

Figure 3:
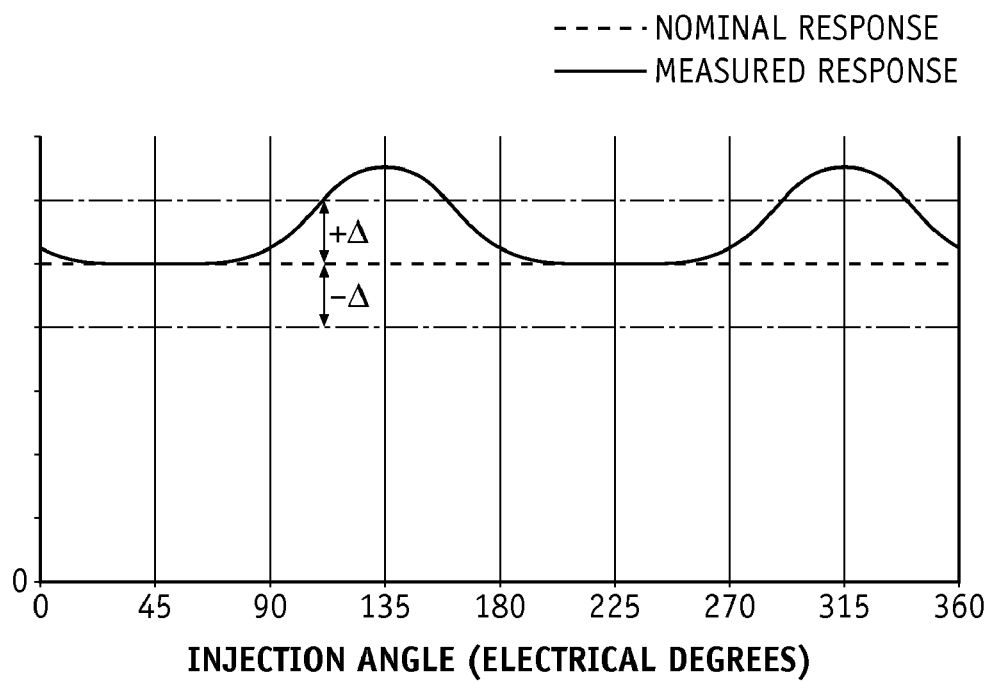
FIG. 3 is a graph of a measured response versus injection angle for a non-salient machine suitable for use with the stator diagnostic process of FIG. 2 in accordance with one embodiment.

FIG. 3 depicts a graph of the measured response value and the nominal response value versus injection angle over one electrical cycle for a non-salient electric motor in an exemplary embodiment. As shown, the nominal response value for the non-salient machine is substantially uniform over the full electrical cycle. Referring now to FIG. 2 and FIG. 3, in an exemplary embodiment, the stator diagnostic process 200 begins by setting the injection angle to an initial injection angle of zero degrees with respect to the d-axis of the synchronous reference frame (e.g., task 206). The stator diagnostic process 200 applies the injection signal at an injection angle of zero degrees for a predetermined period of time, measures the response signal in the stator windings, and determines the measured response value for the electric motor at the injection angle (e.g., tasks 208, 210, 212). The stator diagnostic process 200 then obtains the nominal response value for the electric motor for the injection angle of zero degrees (e.g., task 214). In the illustrated embodiment, the difference between the measured response value and the nominal response value is less than the threshold value (A) at the injection angle of zero degrees (e.g., task 216). The stator diagnostic process 200 continues by incrementally increasing the injection angle by a fixed increment amount and repeats the steps of applying the injection signal and determining whether the difference between the measured response and the nominal response exceeds the threshold value (e.g., tasks 206, 208, 210, 212, 214, 216, 220, 222).

In the illustrated embodiment, the difference between the measured response value and the nominal response value exceeds the threshold amount at an injection angle before 135° electrical, at about 115° electrical. When the difference exceeds the threshold amount, the stator diagnostic process 200 identifies the presence of a fault condition and takes remedial action, such as, for example, preventing the electric motor from starting (i.e., preventing the rotor from spinning) (e.g., tasks 216, 218). Although FIG. 3 depicts the measured response value and nominal response value over a full electrical cycle of injection angles, in practice, the stator diagnostic process 200 may exit once the fault condition is detected even though the injection angle may not have traversed the threshold angle.

Figure 4:
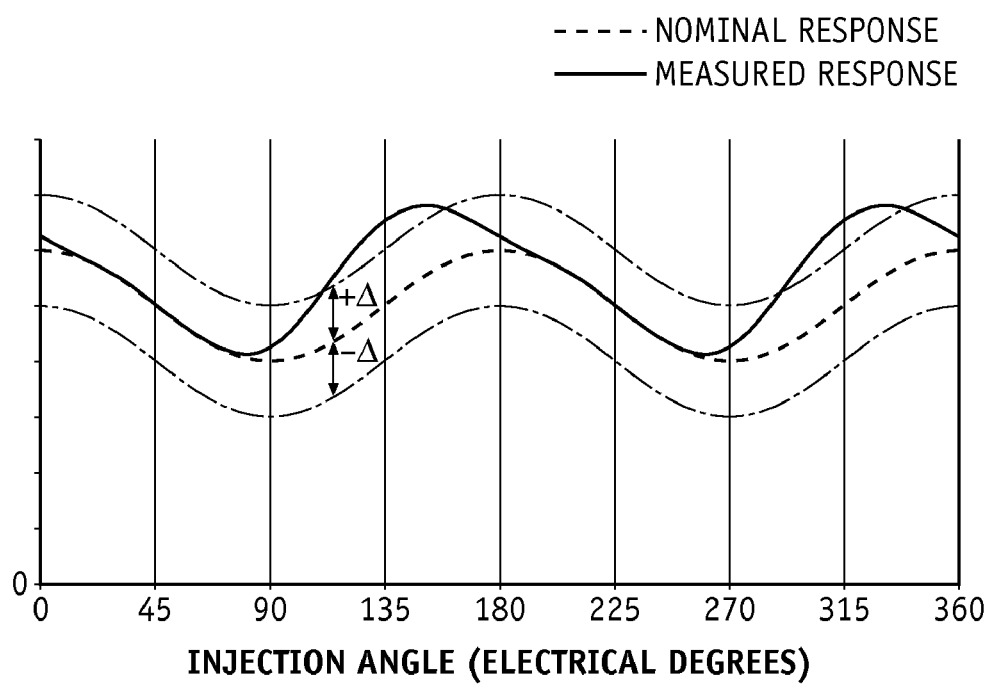
FIG. 4 is a graph of a measured response versus injection angle for a salient machine suitable for use with the stator diagnostic process of FIG. 2 in accordance with one embodiment.

FIG. 4 depicts a graph of the measured response value and the nominal response value versus injection angle over one electrical cycle for a salient electric motor in an exemplary embodiment. In the illustrated embodiment, the nominal response of the electric motor is periodic, in which case, the difference between the threshold angle and the initial injection angle should be greater than or equal to the length of the period, in this case, 180° electrical. Referring now to FIG. 2 and FIG. 4, in an exemplary embodiment, the stator diagnostic process 200 begins by setting the injection angle to an initial injection angle of zero degrees with respect to the d-axis of the synchronous reference frame in a similar manner as set forth above (e.g., task 206). The stator diagnostic process 200 continues by repeating the steps of applying the injection signal, determining whether the difference between the measured response and the nominal response exceeds the threshold value, and incrementally increasing the injection angle until the threshold angle is reached or a fault-condition is identified (e.g., tasks 206, 208, 210, 212, 214, 216, 220, 222). When the difference between the measured response value and the nominal response value exceeds the threshold amount (e.g., at about 115° electrical), the stator diagnostic process 200 identifies the presence of a fault condition and takes remedial action in a similar manner as set forth above (e.g., tasks 216, 218). In addition, the stator diagnostic process 200 may exit once the fault condition is detected even though the injection angle may not have traversed the threshold angle.

To briefly summarize, one advantage of the system and/or method described above is that the stator windings of an electric motor may be diagnosed without operating the motor (i.e., without the rotor spinning). A high-frequency signal is applied to the stator windings at an injection angle and the measured response is compared to a nominal response for the electric motor at the electric motor, thereby allowing changes in the impedance of the stator windings to be identified. The stator windings may be diagnosed at start-up, thereby preventing and/or avoiding operating an electric motor with stator winding faults. The injection signal puts a limited amount of stress on the electric motor compared to other prior art techniques (e.g., surge testing) and, in addition, can detect both shorted and open windings for either series or parallel connected windings.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for identifying a fault condition in stator windings in an electric motor, the method comprising:
    applying a first signal at a first electrical angle to the stator windings, the first signal having a frequency such that a rotational speed of a rotor of the electric motor is substantially equal to zero;
    measuring a second signal from the stator windings in response to the first signal;
    determining a measured response for the electric motor at the first electrical angle based on the second signal;
    obtaining a nominal response for the electric motor at the first electrical angle; and
    identifying the fault condition when a magnitude of the difference between the measured response and the nominal response is greater than a threshold value.

2. The method of claim 1, wherein:
    applying the first signal comprises applying a voltage signal at the first electrical angle to the stator windings; and
    measuring the second signal comprises measuring a current signal through the stator windings at the first electrical angle, wherein the current signal is influenced by an impedance of the electric motor at the first electrical angle.

3. The method of claim 1, wherein if the magnitude of the difference between the measured response and the nominal response is less than the threshold value, the method further comprises:
    incrementing the first electrical angle by a first amount resulting in a second electrical angle;
    applying the first signal at the second electrical angle to the stator windings;
    measuring a third signal from the stator windings in response to the first signal at the second electrical angle;
    determining a second measured response for the electric motor at the second electrical angle based on the third signal;
    obtaining a second nominal response for the electric motor at the second electrical angle; and
    identifying the fault condition when a magnitude of the difference between the second measured response and the second nominal response is greater than the threshold value.

4. The method of claim 3, further comprising:
    obtaining a position for a rotor of the electric motor; and
    determining a reference frame based on the position of the rotor, the first electrical angle being measured with respect to an axis of the reference frame, wherein incrementing the first electrical angle comprises increasing the first electrical angle with respect to the axis by the first amount.

5. The method of claim 1, further comprising operating the electric motor when the magnitude of the difference between the measured response and the nominal response is less than the threshold value and the first electrical angle is greater than or equal to a threshold angle.

6. The method of claim 1, wherein:
    determining the measured response comprises determining an observed impedance for the electric motor at the first electrical angle based on a relationship between the first signal and the second signal; and
    obtaining the nominal response comprises obtaining a nominal impedance for the electric motor at the first electrical angle.

7. The method of claim 1, further comprising, in response to identifying the fault condition, identifying a phase of the stator windings that the fault condition is attributable to based on the injection angle.

8. The method of claim 1, further comprising preventing operation of the electric motor in response to identifying the fault condition.

9. A method for diagnosing an electric motor, the electric motor comprising stator windings and a rotor, the method comprising:
    applying an injection signal at an injection angle to the stator windings, wherein a frequency of the injection signal is configured to avoid rotation of the rotor;
    determining a measured response for the electric motor at the injection angle in response to the injection signal, the measured response being influenced by an impedance of the electric motor at the injection angle; and
    identifying a fault condition when a difference between the measured response and a nominal response for the electric motor at the injection angle is greater than a threshold value.

10. The method of claim 9, further comprising sweeping the injection angle from an initial electrical angle to a final electrical angle.

11. The method of claim 10, wherein sweeping the injection angle from the initial electrical angle to the final electrical angle comprises incrementally increasing the injection angle from the initial electrical angle to the final electrical angle.

12. The method of claim 11, further comprising determining a reference frame based on a position of a rotor of the electric motor, the initial electrical angle being aligned with a first axis of the reference frame, wherein incrementally increasing the injection angle comprises increasing the injection angle with respect to the first axis.

13. The method of claim 9, wherein applying the injection signal at the injection angle comprises applying a voltage signal to the stator windings with an electrical angle equal to the injection angle.

14. The method of claim 13, wherein obtaining the measured response comprises measuring a current signal through the stator windings at the injection angle.

15. The method of claim 14, further comprising obtaining a nominal current response for the electric motor at the injection angle, wherein:
    obtaining the measured response comprises determining an amplitude of the current signal at the injection angle; and
    identifying the fault condition comprises identifying the fault condition when a difference between the amplitude of the current signal and the nominal current response is greater than the threshold value.

16. The method of claim 14, further comprising obtaining a nominal impedance for the electric motor at the injection angle, wherein:
obtaining the measured response comprises determining an observed impedance for the electric motor at the injection angle based on a ratio of the voltage signal to the current signal; and
identifying the fault condition comprises identifying the fault condition when a difference between the observed impedance and the nominal impedance is greater than the threshold value.

17. The method of claim 9, wherein the frequency is greater than 200 Hz.

18. An electrical system for use in a vehicle, the electrical system comprising:
an electric motor having a set of stator windings and a rotor;
an energy source;
an inverter module coupled between the energy source and the set of stator windings;
a current sensor coupled between the inverter module and the set of stator windings, the current sensor being configured to measure current through the set of stator windings; and
a control module coupled to the inverter module and the current sensor, the control module being configured to:
operate the inverter module to apply an injection voltage signal at an injection angle to the set of stator windings, the injection voltage signal having a frequency configured to avoid rotation of the rotor;
determine a measured response value for the injection angle based on a measured current from the current sensor;
obtain a nominal response value for the electric motor at the injection angle; and
identify a fault condition when a difference between the measured response value and the nominal response value is greater than a threshold value.

19. The electrical system of claim 18, wherein the control module is configured to sweep the injection angle from an initial electrical angle to a final electrical angle.

20. The electrical system of claim 19, further comprising a resolver system coupled to the electric motor and the control module, the resolver system being configured to obtain a position for the rotor, wherein the control module is configured to:
determine a reference frame based on the position of the rotor, the injection angle being measured with respect to an axis of the reference frame; and
sweep the injection angle by incrementally increasing the injection angle with respect to the axis of the reference frame when the difference between the measured response value and the nominal response value is not greater than the threshold value.

* * * * *